(12) United States Patent
Cohen et al.

(10) Patent No.: US 10,197,685 B2
(45) Date of Patent: Feb. 5, 2019

(54) METHOD FOR CONTROLLING GALLIUM CONTENT IN GADOLINIUM-GALLIUM GARNET SCINTILLATORS

(71) Applicant: Siemens Medical Solutions USA, Inc., Malvern, PA (US)

(72) Inventors: Peter Carl Cohen, Knoxville, TN (US); Alexander Andrew Carey, Lenoir City, TN (US); Mark S. Andreaco, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 190 days.

(21) Appl. No.: 14/955,079

(22) Filed: Dec. 1, 2015

(65) Prior Publication Data

US 2017/0153335 A1   Jun. 1, 2017

(51) Int. Cl.
| | | |
|---|---|---|
| *G21K 4/00* | (2006.01) | |
| *C09K 11/64* | (2006.01) | |
| *C09K 11/77* | (2006.01) | |
| *C30B 29/28* | (2006.01) | |
| *G01T 1/202* | (2006.01) | |

(52) U.S. Cl.
CPC .......... *G01T 1/2023* (2013.01); *C09K 11/641* (2013.01); *C09K 11/7706* (2013.01); *C09K 11/7721* (2013.01); *C09K 11/7774* (2013.01); *C30B 29/28* (2013.01); *G21K 4/00* (2013.01)

(58) Field of Classification Search
CPC ... C09K 11/7774; G01T 1/2023; C30B 29/28; C30B 33/02
See application file for complete search history.

(56) References Cited

U.S. PATENT DOCUMENTS

| | | | | |
|---|---|---|---|---|
| 4,055,391 | A * | 10/1977 | Schmidt | C30B 15/10 117/217 |
| 4,350,559 | A * | 9/1982 | Boudot | C01B 13/36 117/13 |
| 5,318,722 | A * | 6/1994 | Tsoukala | C09K 11/7776 252/301.4 R |
| 6,246,744 | B1 * | 6/2001 | Duclos | C09K 11/7769 252/301.4 R |
| 6,361,735 | B1 | 3/2002 | Venkataramani et al. | |
| 6,793,848 | B2 * | 9/2004 | Vartuli | G01T 1/2023 252/301.4 R |
| 7,560,046 | B2 * | 7/2009 | Lyons | C09K 11/7774 252/301.17 |
| 7,595,492 | B2 * | 9/2009 | Nakamura | C09K 11/7774 250/361 R |
| 7,812,077 | B2 | 10/2010 | Borade et al. | |
| 8,309,640 | B2 | 11/2012 | Li et al. | |
| 8,450,412 | B2 | 5/2013 | Elkovitch et al. | |
| 9,243,125 | B2 | 1/2016 | Diaz et al. | |
| 2007/0131908 | A1 | 6/2007 | Krishna et al. | |
| 2013/0270482 | A1 | 10/2013 | Jiang et al. | |
| 2013/0306874 | A1 * | 11/2013 | Yoshikawa | C09K 11/7774 250/361 R |

FOREIGN PATENT DOCUMENTS

| | | | |
|---|---|---|---|
| EP | 463369 | * | 1/1992 |
| EP | 1043383 | A1 | 10/2000 |
| EP | 2826835 | A1 | 1/2015 |
| JP | H04292421 | A | 10/1992 |
| JP | 2001072968 | A | 3/2001 |
| JP | 2010522806 | A | 7/2010 |
| JP | 2013227575 | A | 11/2013 |
| JP | 2017095461 | A | 6/2017 |
| JP | 2017116532 | A | 6/2017 |
| RU | 2324018 | C2 | 10/2008 |
| WO | 2006068130 | A1 | 6/2008 |
| WO | 2013136804 | A1 | 9/2013 |
| WO | WO 2014/171985 | * | 10/2014 |
| WO | 2015118533 | A1 | 8/2015 |

OTHER PUBLICATIONS

Search results from Google search for "scintillator definition"., Jun. 8, 2018.*
Kamada, Kei, et al. "2inch diameter single crystal growth and scintillation properties of Ce: Gd 3 Al 2 Ga 3 O 12." Journal of Crystal Growth 352.1 (2012): 88-90.
O. V. Gorshkova, E. S. Lukin, "Synthesis of gadolinium-gallium garnet", Glass and Ceramics, vol. 39, No. 6 (1982), pp. 299-301.
EP Search Report dated May 4, 2017, EP Application No. 16200837. 9, 9 pages.
Meng, Fang, et al. "Sintered pellets: a simple and cost effective method to predict the performance of GGAG: Ce single crystals." Materials Science and Engineering: B 193 (2015): 20-26.
Office Action dated Dec. 19, 2017 for Corresponding Russian Application No. 2016146848 (with translation).
Office Action dated Jan. 8, 2018 received in Corresponding Korean Application No. 10-2016-0161271 (with translation).
Aleksanyan et al.; "Investigation of luminescence processes in YAG single crystals irradiated by 50 MeV electron beam"; Radiation Measurements 56; 2013, pp. 54-57.
Kirm et al.; "Dependence of the efficiency of various emissions on excitation density in BaF2 crystals"; Radiation Measurements 33; 2001, pp. 515-519.
Kirm et al.; "Relaxation of Electronic Excitations in CsI Crystals Studied by Synchrotron Radiation and Pulsed Electrons"; Radiation Measurements vol. 29, No. 34, 1998, pp. 257-261.

(Continued)

*Primary Examiner* — C Melissa Koslow

(57) ABSTRACT

Disclosed herein is a method including manufacturing a powder having a composition of formula (1), $$M^1_a M^2_b M^3_c M^4_d O_{12} \qquad (1)$$

where O represents oxygen, $M^1$, $M^2$, $M^3$, and $M^4$ represents a first, second, third, and fourth metal that are different from each other, where the sum of a+b+c+d is about 8, where "a" has a value of about 2 to about 3.5, "b" has a value of 0 to about 5, "c" has a value of 0 to about 5 "d" has a value of 0 to about 1, where "b" and "c", "b" and "d", or "c" and "d" cannot both be equal to zero simultaneously, where $M^1$ is a rare earth element comprising gadolinium, yttrium, lutetium, scandium, or a combination of thereof, $M^2$ is aluminum or boron, $M^3$ is gallium, and $M^4$ is a codopant; and heating the powder to a temperature of 500 to 1700° C. in an oxygen containing atmosphere to manufacture a crystalline scintillator.

11 Claims, No Drawings

(56) References Cited

OTHER PUBLICATIONS

Mares et al.; "Scintillation response of Ce-doped or intrinsic scintillating crystals in the range up to 1 MeV"; Radiation Measurements 38; 2004, pp. 353-357.
Murk et al.; "Complex Oxides: Electron Excitations and Their Relaxation"; Radiation Measurements, vol. 24, No. 4.; 1995, pp. 371-374.
Padlyak et al.; "Nature of intrinsic luminescence in the glasses of CaO—Ga2O3—GeO2 system"; Radiation Measurements 38; 2004, pp. 593-597.
Rodnyi; "Progress in fast scintillators"; Radiation Measurements 33; 2001, pp. 605-614.
Sako et al.; "A detailed study on Gd2SiO5 scintillators: recovery from increased photon yield following irradiation"; IOP Publishing for SISSA Medialab; Jun. 24, 2015, 13 pages.
Office action dated Jul. 3, 2018 in JP Application No. 2016-227829, 14 pages, English translation attached.

\* cited by examiner

METHOD FOR CONTROLLING GALLIUM CONTENT IN GADOLINIUM-GALLIUM GARNET SCINTILLATORS

BACKGROUND

This disclosure relates to a method for controlling gallium content in garnet scintillators during a manufacturing process. In particular, this disclosure relates to a method for controlling gallium content in gadolinum-aluminum-garnet scintillators during the manufacturing process.

Gadolinium aluminum gallium garnets (commonly known as GAGG) are promising candidates for use as a scintillator in time of flight (TOF) positron emission tomography (PET) because of its high density of 6.63 grams per cubic centimeter (g/cc), high light output of greater than 65,000 photons/MeV (million electron volts or mega electron volts), and relatively short decay time of 88 nanoseconds (ns)/91% and 258 ns/9%.

GAGG can be grown in the form of large crystal boules of up to 3 inches (about 7.5 centimeters) in diameter from oxides such as cerium dioxide ($CeO_2$), gadolinium oxide ($Gd_2O_3$), gallium oxide ($Ga_2O_3$) and alumina ($Al_2O_3$) that have a purity of 99.99% or greater using Czochralski method. A boule is a single crystal ingot produced by synthetic means.

One of the drawbacks associated with the Czochralski method is that the high temperatures (exceeding 1300° C.) used in the production of the crystal boule result in the decomposition of the gallium oxide to $Ga_2O$ vapor according to the reaction:

(1)

This is an equilibrium reaction and the presence of additional oxygen in the reaction chamber reduces the rate of decomposition of the gallium oxide. In other words, the presence of an increased amount of oxygen in the reaction chamber drives the reverse reaction towards the formation of the gallium oxide rather than towards the formation of the $Ga_2O$ vapor.

The production of the crystal boule is generally conducted in iridium crucibles that are very expensive because of the cost of iridium metal. The use of large amounts of oxygen in the reaction chamber causes the conversion of iridium metal to iridium oxide (which evaporates), which is undesirable because of the high cost associated with the loss of iridium metal.

In order to effect a compromise and to obtain the GAGG crystal boule without any loss or iridium metal, an off-stoichiometric mix of raw oxide materials having 3 weight percent (wt %) excess of the gallium oxide is used to perform the growth process in an atmosphere containing an excess of 2 volume percent oxygen. The presence of excess gallium oxide compensates for the loss due to evaporation of gallium at the elevated process temperatures.

However, this method has its drawbacks as well. Since the evaporation losses of gallium are practically difficult to control, the quality of GAGG crystals may vary significantly. Loss of stoichiometry may cause substantial non-uniformities in the scintillation characteristics of the GAGG crystals such as: variation in light output, uncontrollable scintillation decay time, and a high level of afterglow, all of which are undesirable.

There therefore remains a need for a method to produce crystal boules of the correct stoichiometry while at the same time reducing the losses of gallium oxide or of iridium metal.

SUMMARY

Disclosed herein is a method comprising manufacturing a powder having a composition of formula (1),

(1)

where O represents oxygen, $M^1$, $M^2$, $M^3$, and $M^4$ represents a first, second, third and fourth metal that are different from each other, where the sum of a+b+c+d is about 8, where "a" has a value of about 2 to about 3.5, "b" has a value of 0 to about 5, "c" has a value of 0 to about 5 "d" has a value of 0 to about 1, where "about" is defined as ±10% deviation from the desirable value, where "b" and "c", "b" and "d" or "c" and "d" cannot both be equal to zero simultaneously, where $M^1$ is a rare earth element including but not being limited to gadolinium, yttrium, lutetium, scandium, or a combination of thereof, $M^2$ is aluminum or boron, $M^3$ is gallium and $M^4$ is a dopant and comprises one of thallium, copper, silver, lead, bismuth, indium, tin, antimony, tantalum, tungsten, strontium, barium, boron, magnesium, calcium, cerium, yttrium, scandium, lanthanum, lutetium, praseodymium, terbium, ytterbium, samarium, europium, holmium, dysprosium, erbium, thulium or neodymium, or any combination of thereof; and heating the powder to a temperature of 800 to 1700° C. in an oxygen containing atmosphere to manufacture a crystalline scintillator.

Disclosed herein too is an article manufactured by a method comprising manufacturing a powder having a composition of formula (1),

(1)

where O represents oxygen, $M^1$, $M^2$, $M^3$, and $M^4$ represents a first, second, third and fourth metal that are different from each other, where the sum of a+b+c+d is about 8, where "a" has a value of about 2 to about 3.5, "b" has a value of 0 to about 5, "c" has a value of 0 to about 5 "d" has a value of 0 to about 1, where "about" is defined as ±10% deviation from the desirable value, where "b" and "c", "b" and "d" or "c" and "d" cannot both be equal to zero simultaneously, where $M^1$ is a rare earth element including but not being limited to gadolinium, yttrium, lutetium, scandium, or a combination of thereof, $M^2$ is aluminum or boron, $M^3$ is gallium and $M^4$ is a dopant and comprises one of thallium, copper, silver, lead, bismuth, indium, tin, antimony, tantalum, tungsten, strontium, barium, boron, magnesium, calcium, cerium, yttrium, scandium, lanthanum, lutetium, praseodymium, terbium, ytterbium, samarium, europium, holmium, dysprosium, erbium, thulium or neodymium, or any combination of thereof; and heating the powder to a temperature of 800 to 1700° C. in an oxygen containing atmosphere to manufacture a crystalline scintillator.

DETAILED DESCRIPTION

Disclosed herein is a method for manufacturing polycrystalline or single crystal garnet that comprises gadolinium and gallium (hereinafter "garnet") and that use gallium oxide as a starting raw material. The composition contains one or more elements in addition to gadolinium and gallium in the garnet. In other words, in its simplest form the garnet comprises 3 or more elements.

In an embodiment, the garnets have the formula:

(1)

where O represents oxygen, $M^1$, $M^2$, $M^3$, and $M^4$ represents a first, second, third, and fourth metal that are different from each other, where the sum of a+b+c+d is about 8, where "about" is defined as ±10% deviation from the desirable value, where "a" has a value of about 2 to about 3.5, preferably about 2.4 to about 3.2, and more preferably about 3.0, "b" has a value of 0 to about 5, preferably about 2 to about 3, and more preferably about 2.1 to about 2.5, where "b" and "c", "b" and "d", or "c" and "d" cannot both be equal to zero simultaneously, where "c" has a value of 0 to about 5, preferably about 1 to about 4, preferably about 2 to about 3, and more preferably about 2.1 to about 2.5, "d" has a value of 0 to about 1, preferably about 0.001 to about 0.5, and more preferably 0.003 to 0.3.

In the formula (1), $M^1$ is a rare earth element including but not being limited to gadolinium, yttrium, lutetium, scandium, or a combination of thereof. $M^1$ is preferably gadolinium. In an embodiment $M^2$ is aluminum or boron, $M^3$ is gallium, and $M^4$ is a dopant and comprises one or more of thallium, copper, silver, lead, bismuth, indium, tin, antimony, tantalum, tungsten, strontium, barium, boron, magnesium, calcium, cerium, yttrium, scandium, lanthanum, lutetium, praseodymium, terbium, ytterbium, samarium, europium, holmium, dysprosium, erbium, thulium or neodymium.

For $M^1$, some of the gadolinium can be substituted with one or more of yttrium, lutetium, lanthanum, terbium, praseodymium, neodymium, cerium, samarium, europium, dysprosium, holmium, erbium, ytterbium, or combinations thereof. In an embodiment, some gadolinium can be substituted with yttrium. $M^3$ is preferably aluminum.

In an embodiment, the dopant $M^4$ includes Tl+, Cu+, Ag+, Au+, Pb2+, Bi3+, In+, Sn2+, Sb3+, Ce3+, Pr3+, Eu2+, Yb2+, Nb5+, Ta5+, W6+, Sr2+, B3+, Ba2+, Mg2+, Ca2+, or combinations thereof.

The method comprises manufacturing nanometer and micrometer sized powders of the garnet (and associated oxides and hydroxides that can be converted to the garnet upon heating) and heating these powders to a temperature that is lower than the 1850° C. used for producing single crystals in the Czochralski process. In some embodiments, the nanometer and micrometer sized powders are heated to temperatures of 500 to 1700° C. in an oxygen containing atmosphere to form polycrystalline or single crystal garnets that have the desired stoichiometry without any loss of gallium oxide due to evaporation. The powders can optionally be heated to a temperature of up to 2000° C. to melt them prior to heating them to a temperature of up to 1700° C. in an oxygen containing atmosphere to form polycrystalline or single crystal garnets. The garnet can comprise a combination of a polycrystalline and single crystal material.

Without being limited to theory, it is believed that the gallium ions in each of the compositions of the formula (1) are strongly bonded to the other elements of the composition and so the energy needed to decompose such a molecule is much higher than the energy to decompose the gallium oxide.

The method for manufacturing the nanometer and micrometer-sized powders of the gadolinium-gallium garnet comprises dissolving the desired metal oxides in the desired stoichiometric ratio in a strong acid. To the solution comprising the acid and the dissolved metal oxides is added an excess amount of a strong base. The addition of the base promotes the formation of a precipitate. The precipitate is then separated from the solution using a separation process to produce the garnet and associated unreacted oxides in a powdered form. A crystal boule can then be manufactured from the powders by heating them to temperatures of 500 to less than 2000° C., preferably 850 to 1900° C., and more preferably 900 to 1800° C. to melt the powder. Following the melting, the melted material can be heated to a temperature of 800 to 1700° C., preferably 900 to 110° C., and more preferably 950 to 1050° C. in an oxygen containing atmosphere, to produce in the next stage polycrystalline or single crystals that can be used as scintillators.

The raw materials used for the manufacture of garnets generally comprise gallium oxide ($Ga_2O_3$) and gadolinium oxide ($Gd_2O_3$), and these materials are added to a reaction vessel in the desired stoichiometric quantities. The gallium oxide ($Ga_2O_3$) and gadolinium oxide ($Gd_2O_3$) are generally added to the reaction vessel in a molar ratio of 1:0.5 to 0.5:1, preferably 1:0.75 to 0.75:1, and most preferably 0.9:1 to 1:0.9. In an exemplary embodiment, the gallium oxide ($Ga_2O_3$) and gadolinium oxide ($Gd_2O_3$) are generally added to the reaction vessel in a molar ratio of 1:1. A preferred form of gallium oxide is β-gallium (III) oxide. A preferred form of aluminum oxide is α-alumina ($α-Al_2O_3$).

Additional "metal oxides" such as oxides of cerium, aluminum, scandium, yttrium, lanthanum, lutetium, praseodymium, terbium, ytterbium, neodymium, or combinations thereof can also be added to the reaction vessel in the desired stoichiometric quantities. Exemplary additional "metal oxides" are cerium dioxide ($CeO_2$), aluminum oxide ($Al_2O_3$), yttrium oxide ($Y_2O_3$), lutetium (III) oxide ($Lu_2O_3$), scandium (III) oxide ($Sc_2O_3$), or a combination thereof. It is desirable for the metal oxides used in the manufacturing of the garnet to have a purity of 99.99% or greater.

In some embodiments, one or more of cerium dioxide ($CeO_2$), yttrium oxide ($Y_2O_3$), lutetium (III) oxide ($Lu_2O_3$), and scandium (III) oxide ($Sc_2O_3$) can be present in the garnet in addition to the aluminum oxide ($A_2O_3$). The other metal oxides can be present in a mole ratio of 0.1:1 to 1:0.1, preferably 0.2:1 to 1:0.2, and more preferably 0.5:1 to 1:0.5 with respect to the gallium oxide ($Ga_2O_3$).

In an exemplary embodiment, the garnet includes only aluminum oxide as the additional "metal oxide" component. In these embodiments, the garnet includes aluminum oxide in a molar ratio of 2:3 to 3:2 with respect to the number of moles of the gallium oxide ($Ga_2O_3$). In other embodiments, the garnet can also contain cerium oxide in a molar ratio of 1:3 to 3:1 with respect to the number of moles of the gallium oxide ($Ga_2O_3$), when the garnet also contains aluminum oxide.

The raw materials (e.g., a mixture comprising gallium oxide, gadolinium oxide, aluminum oxide and/or cerium oxide) are then dissolved in a strong acid to form a solution. Examples of strong acids are hydrochloric acid, nitric acid, sulfuric acid, or a combination thereof. In an exemplary embodiment, the strong acid is hydrochloric acid present in an amount of 25 to 50 mole percent, preferably 30 to 40 mole percent in water.

The solution is prepared by agitation the raw materials in the hydrochloric acid. Agitation can be accomplished by stirring, use of ultrasonic sonication, sparging, physical vibration, or combinations thereof. The solution can be manufactured at any temperature though room temperature is preferred.

After the oxides have dissolved, dopants can be added to the solution. Suitable dopants are cerium, aluminum, scandium, yttrium, lanthanum, lutetium, praseodymium, terbium, ytterbium, neodymium, or a combination thereof. These dopants can be added to the solution in the form of the respective metal halides. Preferred halides are chlorides, bromides, or a combination thereof. It is to be noted that these dopants can be added to the solution even if it contains a certain amount of the dopant already previously added in the form of a metal oxide.

For example, cerium can be added to the solution in the form of cerium chloride, cerium bromide, or a combination thereof, even if the solution contains cerium that was previously added in the form of cerium oxide as detailed above.

The metal halide can be added as a dopant to the solution of the garnet in a mole ratio of 0.1:1 to 1:0.1, preferably 0.2:1 to 1:0.2, and more preferably 0.5:1 to 1:0.5 with respect to the number of moles of gallium oxide ($Ga_2O_3$).

The solution is then treated with an excess of a strong base in a reaction vessel to facilitate a precipitation of the dissolved metal oxides. The solution is added to the base in a reaction vessel under strong agitation. Examples of strong bases are ammonium hydroxide, ammonium bicarbonate, potassium hydroxide, sodium hydroxide, or the like, or a combination thereof. The strong base is dissolved in water in an amount of 15 to 50 mole percent, preferably 20 to 40 mole percent.

The molar ratio of acid present in the solution to the base is greater than 1:1.10, preferably greater than 1:1.20, and more preferably greater than 1:1.50.

The addition of the solution to the base causes a precipitation of the garnet. The precipitate is subjected to a separation process to extract the garnet from the remainder to the solution. Separation processes include centrifugation, filtration, decantation, or a combination thereof. Filtration is preferred.

The filtrate is subjected to additional washing steps with water to remove traces of acid, salts, and base from the precipitate. The precipitate in powdered form comprises the garnet (along with one or more additional elements) as well as oxides and hydroxides of the original metals used in the reaction vessel. The precipitate obtained after the separation of the garnet is in the form of particles that have a particle size in the nanometer range and in the micrometer range. The particles have an average particle size that range from 5 nanometers to 500 micrometers, preferably 10 nanometers to 50 micrometers, and more preferably 1 to 20 micrometers. The radius of gyration of the particles is measured to determine average particle size. Light scattering or electron microscopy can be used to determine the particle size.

The powders can be optionally further pulverized in a ball mill, roll mill or other pulverizing device. The pulverized powders can then be subjected to an optional sieving process if it is desirable to use particles of a particular size.

The powders of the garnet are then processed at temperatures of 800 to 1700° C., preferably 900 to 1100° C., and more preferably 950 to 1050° C. in an oxygen containing atmosphere, to produce in the next stage polycrystalline or single crystals that can be used as scintillators.

Single crystals can be produced by the Czochralski method, the Bridgman technique, the Kyropoulos technique, and the Verneuil technique.

In the Czochralski method, the powder to be grown is melted under a controlled atmosphere in a suitable non-reacting container. By controlling the furnace temperature up to 1700 C°, the material is melted. A seed crystal is lowered to touch the molten charge. When the temperature of the seed is maintained very low compared to the temperature of the melt (by a suitable water cooling arrangement), the molten charge in contact with the seed will solidify on the seed. Then the seed is pulled at a controlled rate. The majority of crystals are produced by pulling from the melt. Crystals of dimensions 3 to 40 centimeters can be grown using this method.

In the Bridgman (pulling method) technique, the material is melted in a vertical cylindrical container (called an ampoule), tapered conically with a point bottom. The container is lowered slowly from the hot zone of the furnace having a temperature up to 1700° C. into the cold zone. The rates of movement for such processes range from about 1-30 mm/hr. Crystallization begins at the tip and continues usually by growth from the first formed nucleus. Due to a directed and controlled cooling process of the cast, zones of aligned crystal lattices are created. In other words, a single crystal can be created.

In the Kyropoulos technique, the crystal is grown in a larger diameter than in the aforementioned two methods. As in the Czochralski method, here too a seed is brought into contact with the melt and is not raised much during the growth, i.e., part of the seed is allowed to melt and a short, narrow neck is grown. After this, the vertical motion of the seed is stopped and growth proceeds by decreasing the power into the melt.

In the Verneuil technique, (flame fusion) a fine dry powder of size 1 to 20 micrometers of the material to be grown is shaken through the wire mesh and allowed to fall through the oxy-hydrogen flame. The powder melts and a film of liquid is formed on the top of a seed crystal. This freezes progressively as the seed crystal is slowly lowered. The art of the method is to balance the rate of charge feed and the rate of lowering of the seed to maintain a constant growth rate and diameter. By this method ruby crystals are grown up to 90 millimeters in diameter. This technique is widely used for the growth of synthetic gems and variety of high melting oxides.

Examples of polycrystalline or single crystals grown by this method have the following formulas—$Gd_3Al_2Ga_3O_{12}$ (GAGG—gadolinium-aluminum-gallium garnet), $Gd_3Ga_{2.5}Al_{2.5}O_{12}$ (GGAG—gadolinium-gallium-aluminum garnet), $Gd_{1.5}Y_{1.5}Ga_{2.5}Al_{2.5}O_{12}$ (GYGAG—gadolinium-yttrium-gallium-aluminum garnet), $Gd_3Sc_2Ga_3O_{12}$ (GSGG—gadolinium-scandium-gallium-garnet), or $Gd_{1.5}Lu_{1.5}Al_{1.5}Ga_{1.5}O_{12}$. Each of the polycrystalline or single crystals represented by the aforementioned formulas can be doped with cerium if desired.

The polycrystalline or single crystals manufactured using nanometers and micrometer size powders have a more consistent stoichiometry when compared with materials manufactured using melted oxide compounds. Scintillator materials manufactured by this method can be used in imaging devices such as, for example, positron emission tomography, computed tomography or single photon emission computed tomography machines.

It is to be noted that all ranges detailed herein include the endpoints. Numerical values from different ranges are combinable. The compositions, methods, and articles can alternatively comprise, consist of, or consist essentially of, any appropriate components or steps herein disclosed. The compositions, methods, and articles can additionally, or alternatively, be formulated so as to be devoid, or substantially free, of any steps, components, materials, ingredients, adjuvants, or species that are otherwise not necessary to the achievement of the function and/or objectives of the compositions, methods, and articles. "Combinations" is inclusive of blends, mixtures, alloys, reaction products, and the like. The terms "a" and "an" and "the" do not denote a limitation of quantity, and are to be construed to cover both the singular and the plural, unless otherwise indicated herein or clearly contradicted by context. "Or" means "and/or" unless clearly stated otherwise. Reference throughout the specification to "some embodiments", "an embodiment", and so forth, means that a particular element described in connection with the embodiment is included in at least one embodiment described herein, and may or may not be present in other embodiments. In addition, it is to be understood that the described elements may be combined in any suitable manner in the various embodiments.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A method comprising:
dissolving gallium oxide, gadolinium oxide, aluminum oxide or boron oxide, and optionally at least one oxide of cerium, scandium, yttrium, lanthanum, lutetium, praseodymium, terbium, ytterbium, and neodymium in an acid to form a solution; where the acid is hydrochloric acid, nitric acid, sulfuric acid or a combination thereof;
adding a dopant to the solution, where the dopant is a halide of cerium, aluminum, scandium, yttrium, lanthanum, lutetium, praseodymium, terbium, ytterbium, neodymium, or a combinations thereof;
manufacturing a powder having a composition of formula (1):

$$M^1_a M^2_b M^3_c M^4_d O_{12} \qquad (1)$$

where
O represents oxygen,
$M^1$, $M^2$, $M^3$, and $M^4$ represent a first, second, third, and fourth metal that are different from each other,
the sum of a+b+c+d is about 8, where
"a" has a value of about 2 to about 3.5,
"b" has a value of 2 to about 5
"c" has a value of 1 to about 5, and
"d" has a value of 0.001 to about 1,
$M^1$ is a rare earth element of gadolinium and optionally at least one of cerium, scandium, yttrium, lanthanum, lutetium, praseodymium, terbium, ytterbium, and neodymium,
$M^2$ is aluminum or boron
$M^3$ is gallium, and
$M^4$ is a dopant and is one of cerium, aluminum, yttrium, scandium, lanthanum, lutetium, praseodymium, terbium, ytterbium, neodymium, and combinations thereof;
heating the powder to a temperature of 500 to 2000° C. to melt the powder; and
heating the powder to a temperature of 800-1700° C. in an oxygen containing atmosphere to manufacture a crystalline scintillator; wherein the melting of the powder is conducted prior to the heating of the powder to a temperature of 800-1700° C. in an oxygen containing atmosphere to manufacture a crystalline scintillator.

2. The method of claim 1, where $M^1$ is gadolinium and $M^2$ is aluminum.

3. The method of claim 1, where
"a" has a value about 2.4 to about 3.2,
"b" has a value of about 2 to about 3,
"c" has a value of about 1 to about 4, and
"d" has a value of about 0.001 to about 0.5.

4. The method of claim 3, where
"a" has a value of about 3,
"b" has a value of about 2.1 to about 2.5,
"c" has a value of about 2 to about 3, and
"d" has a value of about 0.003 to about 0.3.

5. The method of claim 1, where the acid is hydrochloric acid; where the hydrochloric acid is present in an amount of 25 to 50 mole percent in water.

6. The method of claim 1, further comprising adding the solution to an excess of a strong base and precipitating the garnet from the solution to form a powder.

7. The method of claim 6, where the base is ammonium hydroxide, ammonium bicarbonate, potassium hydroxide, sodium hydroxide or a combination thereof.

8. The method of claim 6, further comprising washing the powder and subjecting it to further grinding.

9. The method of claim 8, where the powder has average particle sizes of 5 nanometers to 500 micrometers.

10. The method of claim 1, where the crystalline scintillator comprises a single crystal, a polycrystalline material or a combination thereof.

11. The method of claim 10, where the single crystal is produced by the Czochralski method, the Bridgman technique, the Kyropoulos technique, or the Verneuil technique.

* * * * *